(12) United States Patent
Sagues et al.

(10) Patent No.: US 6,304,051 B1
(45) Date of Patent: Oct. 16, 2001

(54) SELF TEACHING ROBOTIC CARRIER HANDLING SYSTEM

(75) Inventors: Paul Sagues, Ross; Robert T. Wiggers; Nathan H. Harding, both of San Francisco; Sanjay K. Aggarwal, Berkeley, all of CA (US)

(73) Assignee: Berkeley Process Control, Inc., Richmond, CA (US)

( * ) Notice: Subject to any disclaimer, the term of this patent is extended or adjusted under 35 U.S.C. 154(b) by 0 days.

(21) Appl. No.: 09/592,314

(22) Filed: Jun. 13, 2000

Related U.S. Application Data

(63) Continuation-in-part of application No. 09/564,300, filed on May 3, 2000, and a continuation-in-part of application No. 09/524,025, filed on Mar. 13, 2000, and a continuation-in-part of application No. 09/270,261, filed on Mar. 15, 1999, now Pat. No. 6,075,334.

(51) Int. Cl.$^7$ ........................................................ B25J 9/18
(52) U.S. Cl. ................................. 318/568.11; 318/568.15; 318/568.16; 318/568.21; 318/570; 318/574
(58) Field of Search .......................... 318/568.11, 568.15, 318/568.16, 568.21, 570, 574; 414/744.6, 416; 901/47, 640

(56) References Cited

U.S. PATENT DOCUMENTS

| 5,019,233 | * | 5/1991 | Blake et al. | 318/560 |
|---|---|---|---|---|
| 5,563,798 | * | 10/1996 | Berken et al. | 901/47 |
| 6,075,334 | * | 6/2000 | Sagues et al. | 318/568.11 |

* cited by examiner

Primary Examiner—Karen Masih
(74) Attorney, Agent, or Firm—Pillsbury Winthrop LLP; David H. Jaffer

(57) ABSTRACT

Briefly, a preferred embodiment of the present invention includes a wafer carrier buffer for storage of a plurality of carriers containing wafers either waiting to be taken for processing in an adjacent wafer processing system, or waiting to be taken from the buffer following the processing. The buffer has a sliding carrier first input apparatus for taking a carrier from outside the buffer through a buffer input door and into the buffer interior. A buffer controller is included for directing robotic apparatus to take the carrier from the input apparatus and place it on a selected one of a plurality of carrier storage locations, and from a carrier storage location to a first output for delivery of wafers to processing. The robotic apparatus also delivers an empty carrier to a second input apparatus for receiving wafers from the processing area, and for delivery of a carrier with processed wafers to a second sliding output apparatus for removal from the buffer through a buffer output door. The controller is programmed to direct an automatic calibration of all of the carrier storage locations and the input and output positions. The robotic apparatus includes a sensor for detecting the position of a flange on a calibration fixture that is placed by the robot at a carrier storage location. The flange is accurately positioned on the fixture to correspond to a similar flange on each carrier that is used to engage with a tool on the robotic apparatus for moving the carrier. The calibration is preferably done by directing the robotic apparatus to place the calibration fixture at a location in need of calibration and then sensing the precise position of the fixture flange with the sensor apparatus. The controller then calculates the coordinates required to place a carrier accurately in that location. This process is repeated for each carrier storage location and the input and output locations.

20 Claims, 5 Drawing Sheets

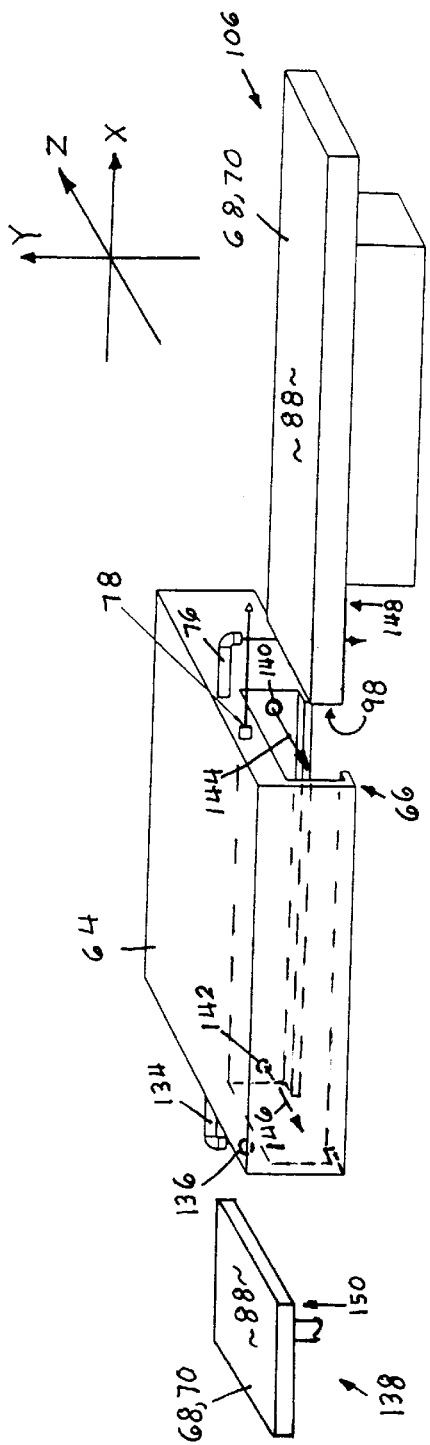
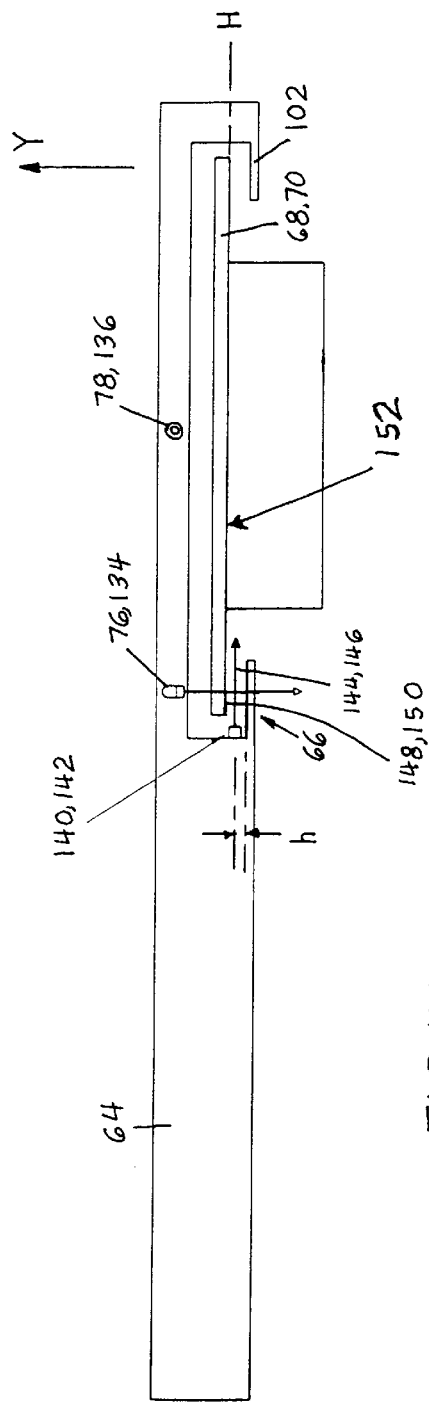
FIG 4a
FIG 4b

SELF TEACHING ROBOTIC CARRIER HANDLING SYSTEM

The present application is a continuation-in-part of U.S. patent applications Ser. Nos. 09/270,261 filed Mar. 15, 1999 now U.S. Pat. No. 6,075,334, and 09/524,025 filed Mar. 13, 2000, and 09/564,300 filed May 3, 2000.

BACKGROUND OF THE INVENTION

1. Field of the Invention

The present invention relates to buffer apparatus for storing carriers for holding wafers before and after input and output from a wafer processing area, and more specifically to a buffer incorporating a self teaching robotic system for moving the wafer carriers in the buffer.

2. Description of the Prior Art

In fabricating semiconductors, silicon wafers need to be stored in buffer facilities at various stages, such as before and after process steps. Due to the need for clean room standards in the buffer facility, the wafer carriers, boxes, pods or boats—collectively called carriers are preferably moved with robots in order to avoid possible contamination and to achieve the efficiency of automation. Each carrier must be picked up from an input position, placed on a shelf in a storage location, and then later moved to a platform for transfer of wafers into a processing area. The coordinates of the shelf or platform must be precisely known in order for processing robotics to be conveniently programmed to safely move the carrier. Due to the large dimensions of a buffer/storage area, it is not practical to hold either the absolute or relative carrier locations to the tolerances required by the robot. Neither is it usually practical to hold the robot tolerances required for accurate picking and placing In order to assure the close tolerances required, the controller of the robotic element must be reprogrammed or "re-taught" new location data whenever a component is changed, or upon initial setup or when restarted. The term "teach" or "teaching" will be used to describe the process of gathering and entering component/structural location data into the system controller. Due to the need to minimize contaminants in the semiconductor processing environment, most robotic systems are installed in enclosures for control of the atmosphere. In prior art systems, it is generally necessary for a technician to enter the enclosure to position the robot while performing the teaching/calibration operations. These entries can contaminate the clean enclosure. In addition, the cramped, confined enclosure with moving robot parts presents a significant safety problem for the technician. This manual and awkward process is also time consuming and costly, and an inherently subjective process that relies upon the judgment and skill of the technician. For example, using conventional controls, a robot is installed and taught by jogging the robot around and, at each process station, the wafer placement locations are recorded with a teach pendant. Besides consuming many hours, this manual procedure introduces subjectivity and thus a significant possibility for errors. This creates a problem of reproducibility. Whenever a wafer carrier is not perfectly positioned within specification or a machine component wears, settles or malfunctions and requires replacement, the robot must be re-taught because it cannot automatically adapt to such variations. If the robot is not re-taught properly within close tolerances, serious damage or loss of expensive wafers can result.

It is clear from the above description of the prior art that an improved system for handling wafer carriers is needed to eliminate the requirement of an operator entering the buffer enclosure environment for calibration/teaching operations.

SUMMARY

It is therefore an object of the present invention to provide a robotic wafer carrier buffer system that avoids the need for an operator to enter the buffer enclosure for teaching/calibration of the system.

It is a further object of the present invention to provide a robotic wafer carrier buffer system that is capable of self calibration.

It is a still further object of the present invention to provide a robotic wafer carrier buffer system that eliminates enclosure contamination from operator intervention during system teaching operations.

It is another object of the present invention to provide a robotic wafer carrier buffer system that minimizes the time required for system teaching.

Briefly, a preferred embodiment of the present invention includes a wafer carrier buffer for storage of a plurality of carriers containing wafers either waiting to be taken for processing in an adjacent wafer processing system, or waiting to be taken from the buffer following the processing. The buffer has two load ports for taking a carrier from outside the buffer through a buffer input door and into the buffer interior. A buffer controller is included for directing robotic apparatus to take the carrier from the input load port and place it on a selected one of a plurality of carrier storage locations, and from a carrier storage location to a tool access door for delivery of wafers to processing. The robotic apparatus also delivers an empty carrier to a second tool access door for receiving wafers from the processing area, and for delivery of a carrier with processed wafers to a second buffer load port for removal from the buffer through a buffer door. The controller is programmed to direct an automatic calibration of all of the carrier storage locations, the tool access ports and the two load port positions. The robotic apparatus includes a sensor for detecting the position of a flange on a calibration fixture that is placed by the robot at a carrier storage location. The flange is accurately positioned on the fixture to correspond to a similar flange on each carrier that is used to engage with a tool on the robotic apparatus for moving the carrier. The calibration is preferably done by directing the robotic apparatus to place the calibration fixture at a location in need of calibration and then sensing the precise position of the fixture flange with the sensor apparatus. The controller then calculates the coordinates required to place a carrier accurately in that location. This process is repeated for each carrier storage location, the tool access ports and the two load port locations.

IN THE DRAWING

FIG. 4a is a detailed perspective view of the arm and optical detector;

FIG. 4b is a planar view for illustrating the detection of fixture height during drop off.

DETAILED DESCRIPTION OF THE PREFERRED EMBODIMENT

Figures 1A, 1B, 1C:
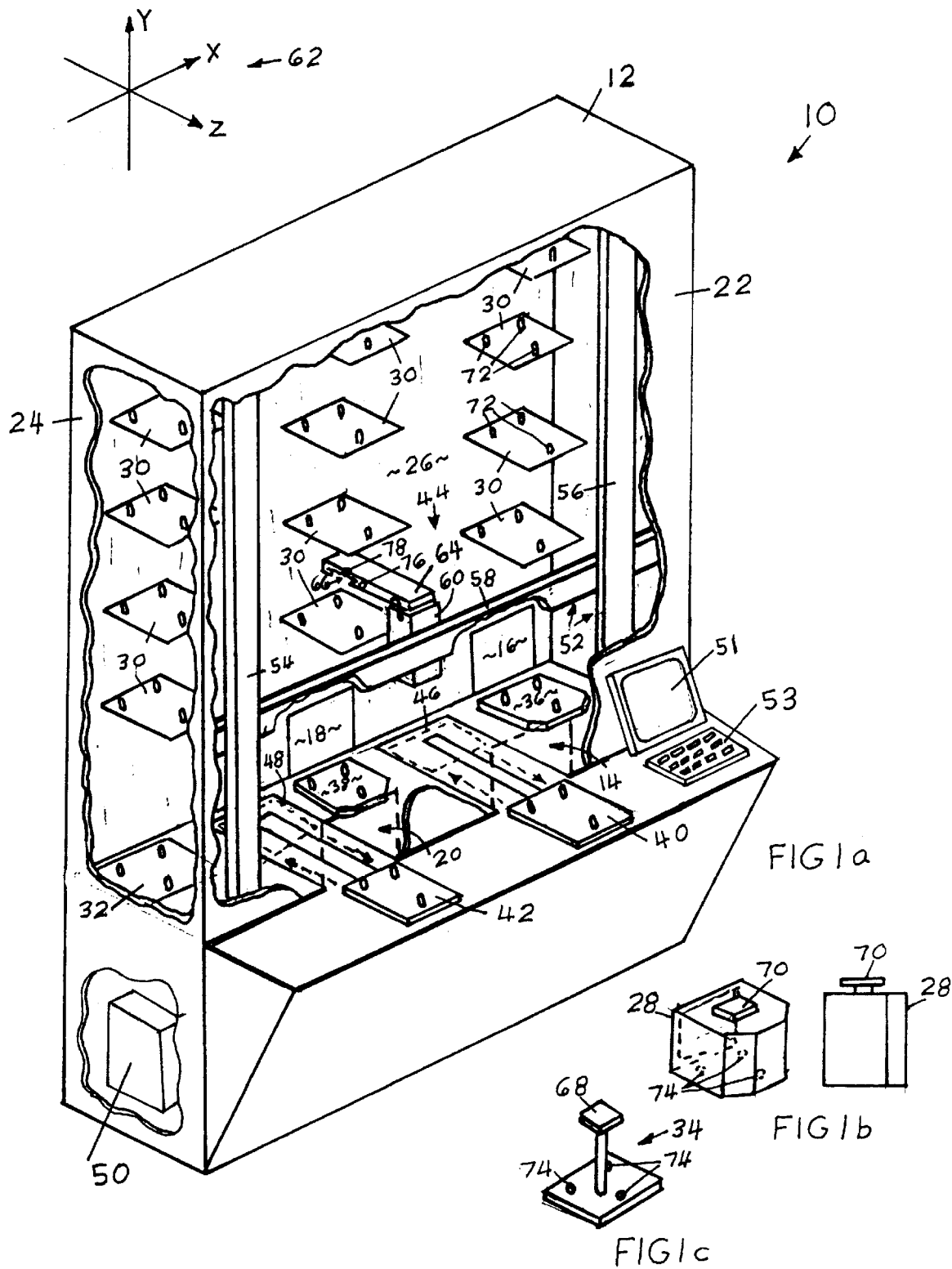
FIG. 1a is a pictorial view of a robotically operated buffer.
FIG. 1b illustrates a wafer carrier.
FIG. 1c illustrates a calibration fixture.

The preferred embodiment of the self teaching buffer apparatus of the present invention will now be described with reference to FIG. 1a of the drawing. A buffer apparatus 10 is symbolically illustrated, and has a housing 12 with four sealable doors including a first load access door 14, a first tool access door 16, a second tool access door 18 and a second load access door 20. The front wall 22 and left side wall 24 are cut away to more clearly illustrate the interior components. The first load access door 14 and second load access door 20 are symbolically noted by dashed lines because they are in the cut away area of the front wall 22. The first load access door 14 and second tool access door 18 in the rear wall 26 are noted with solid lines.

The purpose of the buffer 10 is to store wafer carriers, for example as illustrated by carrier 28 in FIG. 1b. The buffer 10 as shown in FIG. 1a has thirteen storage locations including twelve elevated shelves 30 attached to the rear wall 26 and one location 32 on the tool load port level. According to the preferred embodiment of the present invention, twelve of the locations are used for storage of wafer carriers, and one of the locations is reserved for storage of a calibration fixture 34 illustrated in FIG. 1c. For example, location 32 could be dedicated for storage of the fixture 34. Two platforms 36 and 38 are used for input and output of wafers to and from a wafer processing area (not shown) through doors 16 and 18. Two slidable load port platforms (slides) 40 and 42 are included for input and output of wafer carriers to and from the buffer interior.

A robot 44 is included for moving the carriers from a load port slide 40 at position 46 to a selected storage location, and from a storage location to tool access platform 36. The robot also places an empty carrier on tool access platform 38 so that wafers can be loaded into the carrier from a wafer processing area, and then moves the carrier from the platform 38 to a storage location or to a load port slide 42 in position 48. The robot 44, according to the present invention, also moves the calibration fixture 34 from one location to another during the novel automatic calibration procedure that will be fully described in the following text in reference to the figures of the drawing. All of these operations are directed by a programmed controller 50. FIG. 1a also shows a computer screen 51 and keyboard 53 that can optionally be included in the apparatus for status monitoring and data/instruction input. Communication with the controller 50 can also be accomplished by remote control. The robot 44 includes an x-y gantry 52 including two vertical tracks 54 and 56 and a horizontal track 58. The gantry 52 provides motorized transport of the horizontal track 58 in the vertical (y) direction along the vertical tracks 54 and 56. The gantry 52 also includes a motorized module 60 with facility for moving along the horizontal track 58 in the x direction. The x, y and z directions referred to are defined by the coordinate system illustrated at 62. A horizontal arm 64 is slidably attached to the module 60, the module or arm 64 having motorized apparatus for moving the arm 64 in the z direction. The arm 64 has an elongated C-shaped tool 66 for engagement with a corresponding mating flange 68 on the calibration fixture 34, and on a similar flange 70 on each carrier. Each location 30 and 32, slides 40 and 42, and platforms 36 and 38, has a plurality of dowel pins 72. The pins of each location are accurately positioned relative to each other. Mating dowel pin features 74 are machined in each carrier 28 and the fixture 34. The flanges 70 and 68 are also accurately manufactured, as well as the carrier structure and fixture structure determining the relative position of the flanges 70 and 68 to the dowel pin features 74. As noted in the discussion of the prior art, the tolerances on the positions of the shelves are not accurate enough for precision handling of the carriers, and therefore a calibration routine must be performed to determine their position prior to operation of the buffer system. This calibration routine is performed automatically according to the present invention by incorporating a sensor system into the buffer apparatus 10 to detect a structural feature of each location and output a corresponding signal. The structure in the preferred embodiment is the flange 70 with the fixture mounted at the location being calibrated. The signals are used by the controller to calculate coordinates to determine where to place the tool to properly engage a flange 68 or 70 when the carrier/fixture is in position at a location 30, 32, etc. FIG. 1a shows two optical emitter-detectors 76 and 78 that are used as sensors. An alternate embodiment of the present invention includes a touch sensor apparatus that senses when the arm 64 touches an object. Details of operation of a laser emitter-detector are included in U.S. patent application Ser. Nos. 09/270,261 filed Mar. 15, 1999 and 09/564,300 filed May 3, 2000, and details of a touch sensor are included in U.S. patent application Ser. No. 09/524,025 filed Mar. 13, 2000. The contents of these applications are included in the present disclosure by reference.

Figure 2:
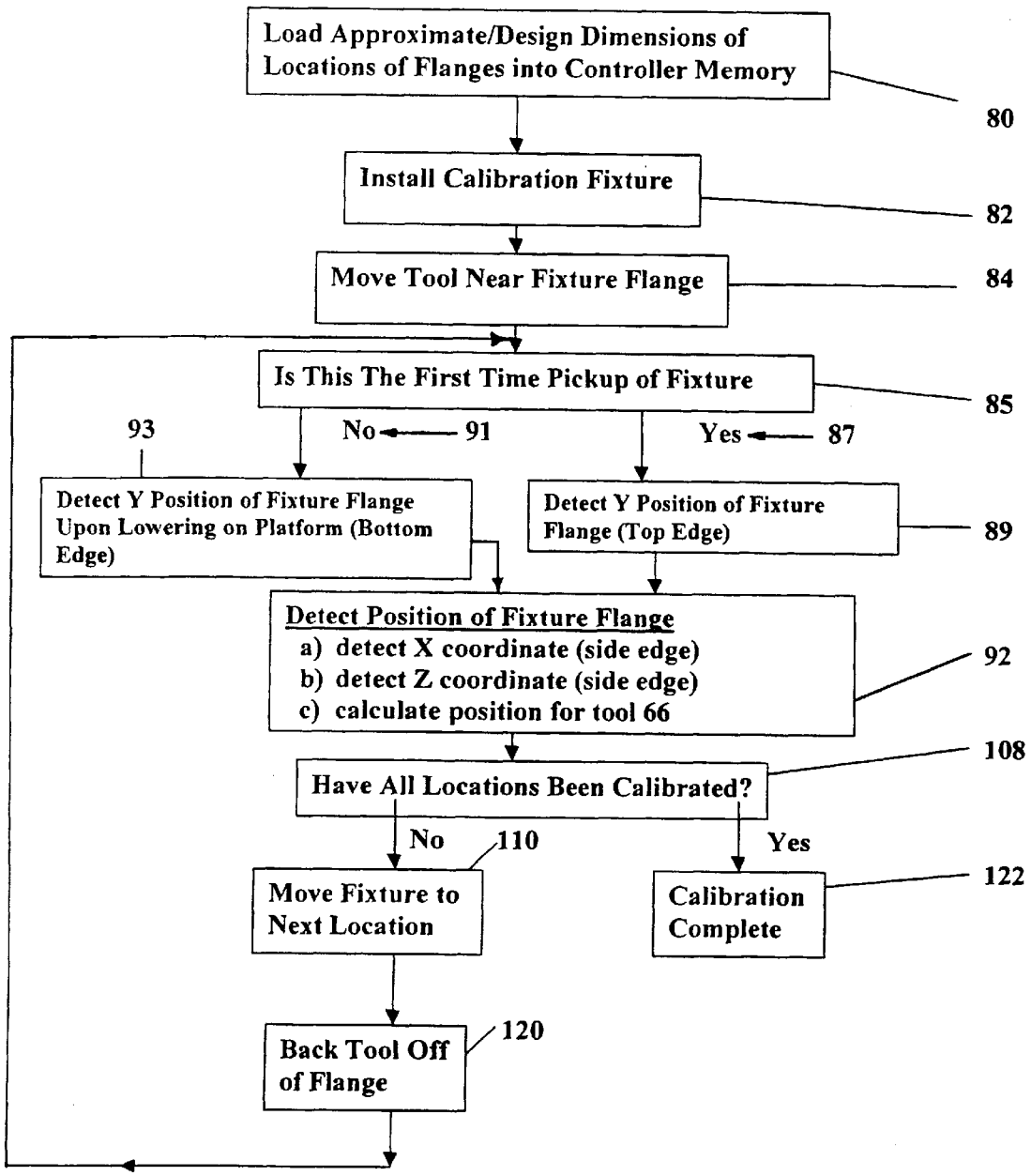
FIG. 2 is a flow chart in description of the automatic calibration system of the present invention.

Referring now to FIG. 2, the controller 50 is programmed (block 80) with the approximate coordinates of where a carrier flange 70 or fixture flange 68 would be at each location 30, 32, etc. These coordinates are calculated from design drawings of the buffer, carrier and fixture. Alternatively, the controller can be programmed to calculate the flange coordinates from the buffer and carrier dimensions. According to the preferred embodiment of the present invention, the calibration fixture 34 is designed with a flange 68 accurately dimensioned relative to the dowel pin mating features 74 to match the corresponding dimensions of the carrier 28. The fixture 34 is used in the calibration procedure.

Figure 3A:
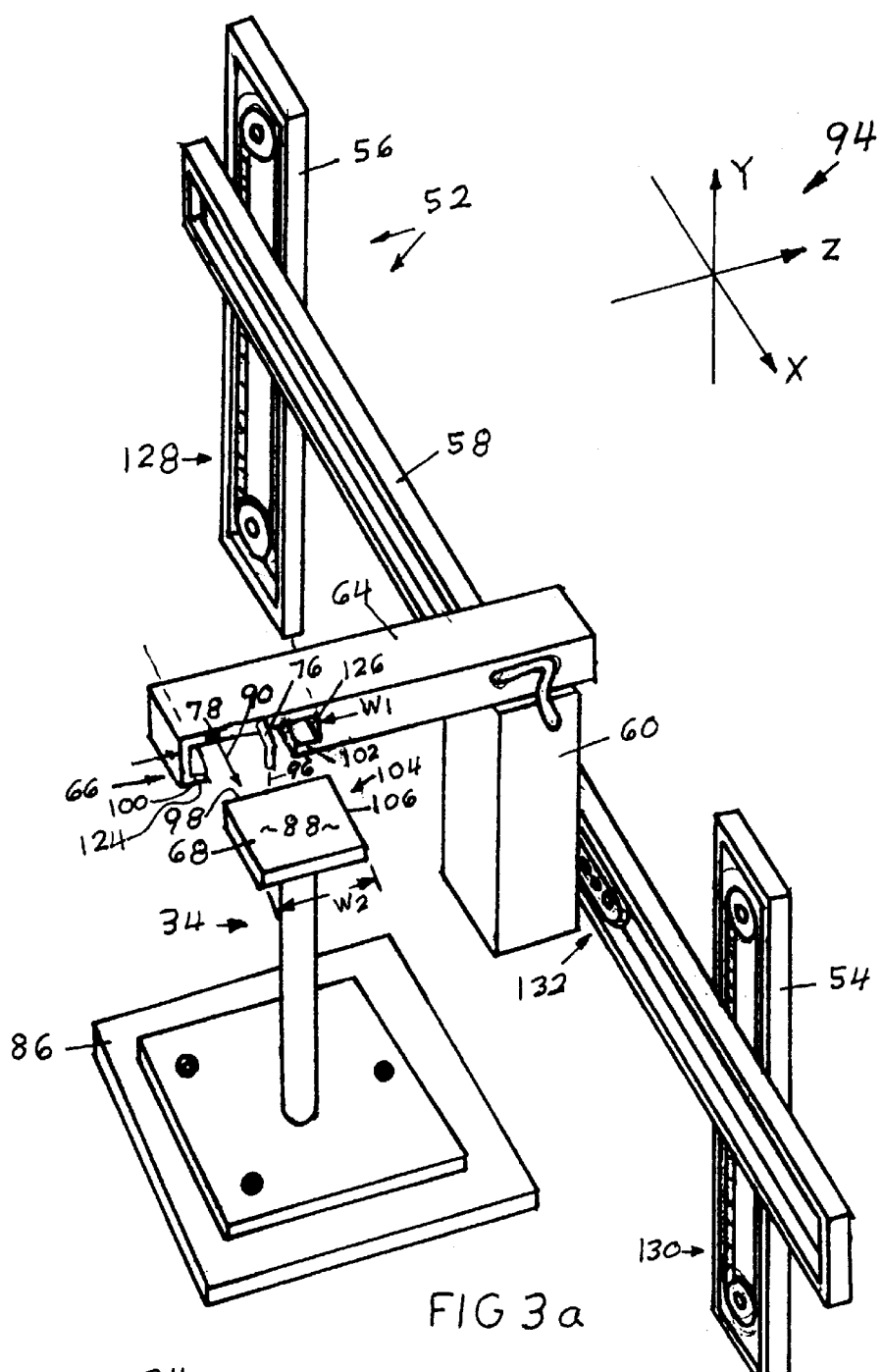
FIG. 3a is an enlarged view of the robot and calibration fixture.

Although the automatic calibration procedure preferably uses the calibration fixture 34, any of a variety of structures accurately manufactured relative to the dowel pins or the dowel pins themselves can be used, and the dimensions obtained from finding the position of the structure can be used to calculate the position of the flange. The calibration procedure using the fixture, first requires that the fixture be located at position 32 (block 82). The controller then directs the robot to place the tool 66 in safe proximity to the fixture flange 68 (block 84), using the approximate coordinate and known tolerances as a guide. This safe proximity is more clearly illustrated in reference to FIG. 3a. The fixture 34 is shown mounted on a base 86 representative of location 32 at this point of the description, but which is representative of any shelf, platform or slide in the following detailed description. The position of the tool 66 is set by the controller to initially place the emitter-detector 78 above the top surface 88 of the flange. As noted above, at this point in the description the calibration of the initial position of the fixture is being described. Block 85 describes the system keeping record of this event, and since it is the first time the fixture is picked up (87), the controller then moves the arm 64 down in the negative y direction until the optical beam 90 reflects off of the edge of the top surface 88 of the flange 68 and is detected (block 89). The controller records this y coordinate as noted in part "a" of block 92. The controller then moves the arm in the x direction (refer to coordinate system 94 in FIG. 3a) until the optical emitter-detector 76 beam 96 (directed in negative y direction) is reflected off of the vertical edge/surface 98 of the flange 68. This x coordinate is then recorded as indicated in block 92 part "b". The controller then calculates a tool 66 position from the dimensions of parts "a" and "b" for optimum engagement with the flange 68, as indicated in block 92 part "d". The controller at this point has y and x coordinates for either picking up the fixture or a carrier from the platform 86, or delivery to the platform 86. It is assumed in this case that the z coordinate is not critical i.e., that the width w1 of the tool 66 opening is dimensioned to allow adequate clearance for the width w2 of the flange 68, and ridges 100 and 102 are adequately extended to capture the width w2, allowing for the approximate coordinates. In this case, the arm 64 can be a permanent, fixed position attachment to the module 60. Referring again to the embodiment with the arm 64 that is moveable in the z direction, the arm 64 can be moved to position the detector 76 to sense a z coordinate by positioning the extended sensor 76 to the right (at 104) of the flange 68 as shown in FIG. 3a and then moving the detector 76 until the beam 96 intercepts the vertical side surface 106. This is indicated in block 92 part c of FIG. 2.

Referring back to block 85, if the fixture has been calibrated in its original position as described above, the answer to block 82 is "No" (91). In this case, the fixture is lowered onto one of the other locations. The calibration of the y position of the flange of the fixture is accomplished when the fixture is fully in place. The position is detected by another optical sensor (see sensors 140 and 142 of FIG. 4a) by detecting the bottom edge (block 93) of the flange. A method of performing this detection will be described in reference to FIG. 4b.

Figure 3B:
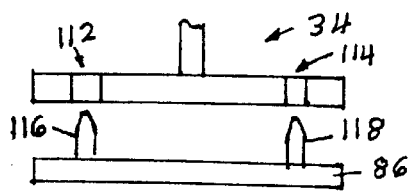
FIG. 3b illustrates the mounting of a carrier/fixture on a storage location.

Upon completing the calibration of a position, the controller then refers to a record kept in a controller memory to determine if all locations have been calibrated (block 108). If another location needs to be calibrated, the controller directs the robot to pick up the fixture 34 and move it to the next location in need of calibration (block 110). The approximate coordinates (block 80) must be sufficiently accurate to allow the controller to move the fixture to a position just above the dowel pins of the location. An adequate tolerance is allowed for by tapering the top of the dowel pins to guide the dowel pin mating feature of a slightly misplaced fixture down onto the pins of the location. This is illustrated in FIG. 3b showing two of the fixture 34 holes (112 and 114) above two of the three tapered dowel pins (116 and 118) of base platform 86. After lowering the fixture onto the dowel pins of the next location, the controller backs the tool off of the flange (block 120), placing it again in the position as illustrated in FIG. 3a, and the process of block 92 is repeated. The steps of blocks 92, 108, 110 and 120 are repeated until all of the locations including the shelves 30, location 32, platforms 36 and 38, and the slides 40 and 42 in positions 46 and 48 have all been calibrated (block 122).

Although optical emitter-detectors 76 and 78 were used in the above description to illustrate the sensing of the position of the flange 68, the robotic apparatus and controller can alternatively be configured to use touch sensing to detect the location of the flange. The details of touch sensing are described in U.S. patent application Ser. No. 90/524,025 filed Mar. 13, 2000. The controller in using touch sensing, for example, can drive the arm 64 to lower itself in the y direction until an edge 124 contacts the flange surface 88 and then records that coordinate. The controller can then move the tool 66 as if engaging the flange 68 and then move the tool in the z direction until, for example, the edge 106 contacts the inner side 126 of the tool. The controller can calibrate the x direction by placing the ridge 100 at a height that is certain to interfere with the flange 68 except for the safe distance as shown in FIG. 3a. The controller then moves the arm 64 toward the flange until the ridge 100 touches the surface 98 and the touch sensor indicates contact. The controller then uses this sensor indication to calculate the x position of the flange 68. From these coordinates, the controller can calculate the optimum position of the tool for engagement with the flange 68 and therefore a corresponding flange 70 of a carrier.

The above description includes calibrating of all three coordinates, or alternatively two coordinates when tolerances allow. If the tolerance of the "approximate" of the various carrier locations are sufficiently accurate, it may also be possible to avoid calibration in the y vertical direction. The spirit of the present invention includes the automatic calibration of either one, two or three coordinates as required to achieve the required accuracy for safe positioning of a carrier.

FIG. 3a also illustrates the robot x-y gantry 52 more clearly. The vertical tracks 54 and 56 are shown with symbolic drive apparatus 128 and 130 for moving the horizontal track 58. The module 60 is also illustrated with apparatus 132 attached for propulsion along the horizontal track 58 in the x direction. The details of mechanical construction of the vertical and horizontal tracks 54, 56 and 58, the module 60, and arm 64 are not described in detail because construction of similar apparatus is well understood by those skilled in the art.

Figure 4C:
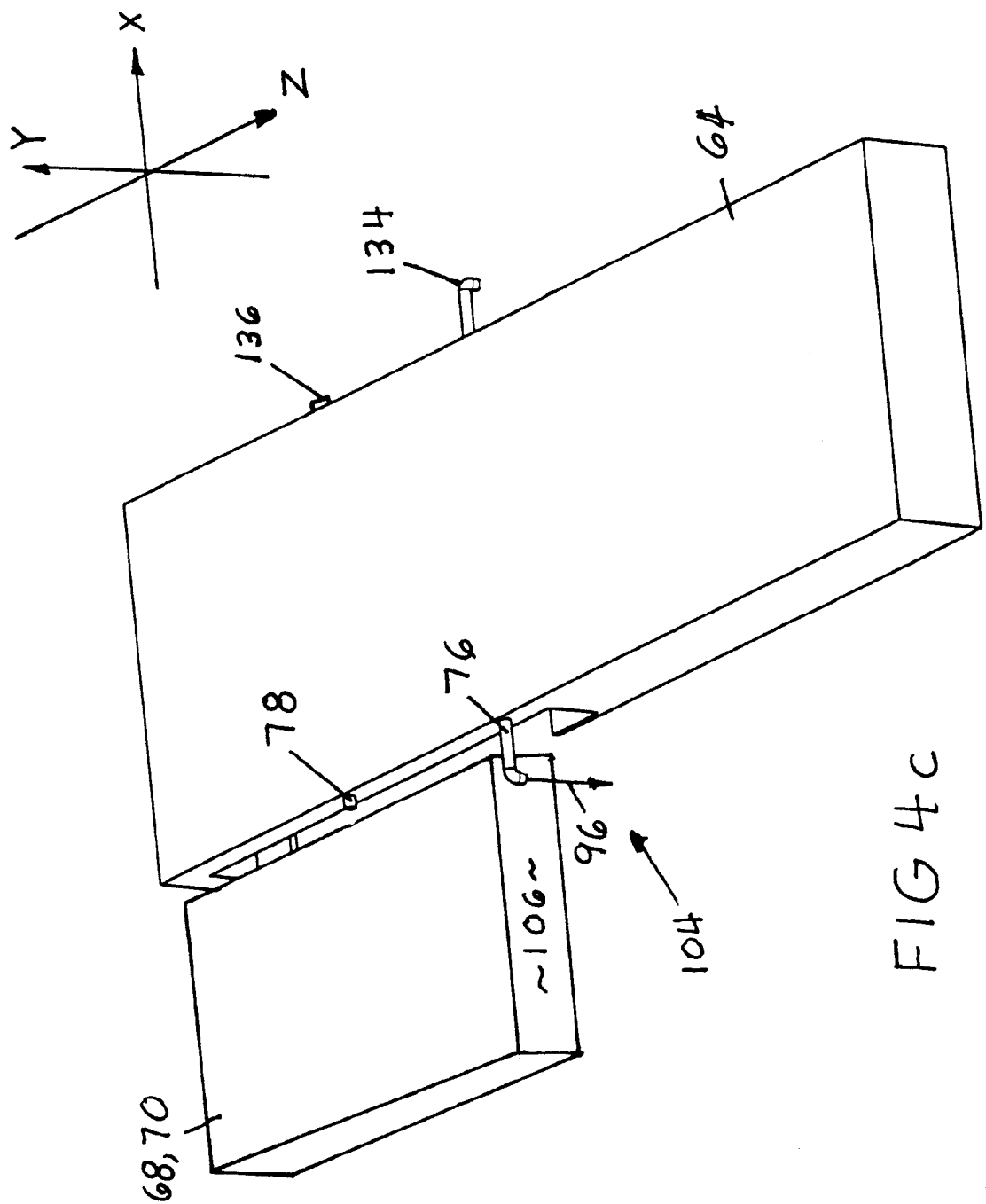
FIG. 4c is a detailed view illustrating the initial Z calibration.

FIGS. 4a, 4b and 4c are expanded views showing the arm 64 and a flange 68 or 70 for illustration of the arrangement and function at the optical emitter detectors 76, 140 and 78, and additional emitter detectors as described.

FIG. 4a shows the arm 64 and a flange which can be either 68 or 70. The tool 66 has detectors 76 and 78 mounted thereon. The detector 78 is for detecting the y coordinate of surface 88, and detector 76 is for detecting the x coordinate of the vertical surface 98 lying in the y-z plane, and the z coordinate of the surface 106 lying in the x-y plane.

FIG. 4a shows an alternate embodiment where emitter-detectors 134 and 136 are provided for use in detecting/calibrating a flange 68, 70 in position at 138 near a side opposite from the side of the tool 66 on which the similar emitter detectors 76 and 78 are attached. Emitter-detector 134 is similar to emitter-detector 76, and emitter-detector 136 is similar to emitter detector 78. Additional emitter-detectors 140 and 142 are provided, supplying beams 144 and 146 in the z direction for detection of the bottom edge/surface 148 or 150 of the flanges 68, 70.

FIG. 4b shows a planar view of the arm 64 and a flange 68 or 70. Three optical emitter detectors are shown, and the illustration neglecting symmetry applies in principle to the detectors on either side of the arm 64, and are labeled accordingly. The detectors 76, 134 and 78, 136 are as described in FIGS. 3a and 4a. FIG. 4b illustrates more clearly the function of detectors 140 and 142 in detecting the bottom surface 148, 150 of the flange 68 or 70, for use by the controller in determining the height (y direction) of the flange 68, 70. The procedure involves inserting the tool 66 over the flange 68, 70 with the flange in the position indicated by the dashed lines 151. Note that the bottom of the flange at 152 is above the level of the beam 144, 146. The controller then moves the tool 66 upward (y direction) until the beam (144, 146) is reflected from the edge of the bottom surface (148, 150) at 152. The controller then records the height (H) and is able to calculate the Y coordinate (location) of the flange for any other y position of the tool 66 as it is moved to a new location. For example, the controller is pre-programmed with the dimension "h" from the inner edge of the ridge 102 to the beam. The controller then "knows" that the flange will move upward to a height Y=(height of optical beam)−h, for a optical beam height >H+h. This data is used by the controller in guiding the fixture and carriers within the buffer. For example, using this data, the controller can calculate when the fixture is free from the dowel pins.

FIG. 4c is a perspective view that illustrates the process of z calibration more clearly. The arm 64 is positioned in close proximity to the flange (68, 70) with the detector 76 in the area of position 104 to the right of the flange 68, 70. The arm 64 is then moved in the negative z direction until the beam 96 intercepts the edge/surface 106. The controller then records the z coordinate.

Although the present invention has been described above in terms of a specific embodiment, it is anticipated that alternations and modifications thereof will no doubt become apparent to those skilled in the art. It is therefore intended that the following claims be interpreted as covering all such alterations and modifications as fall within the true spirit and scope of the invention.

It is claimed that:

1. A wafer carrier storage system comprising:
   a buffer for storing a plurality of wafer carrier, said buffer including
   (a) a plurality of locations, each location for placement of a carrier;
   (b) a robotic apparatus for moving a selected carrier from a first location to a second location, said robotic apparatus including
      (i) a tool apparatus for engagement with a selected carrier;
      (ii) a sensor apparatus for detecting a precision structure at each said location and outputting a corresponding signal;
   (c) a controller for directing operation of said robotic apparatus, said controller programmed to perform automatic calibration by directing said robotic apparatus for determining precision location data of each said precision structure at each said location, and for calculating at least one accurate coordinate for use in placement of a carrier on a selected said location.

2. A storage system as recited in claim 1 wherein
   (a) each said location includes a positioning apparatus for reproduceable location of a wafer carrier at said location; and
   (b) said precision structure provides an accurately known position relative to said positioning apparatus.

3. A storage system as recited in claim 2 wherein said controller is further programmed to include approximate location data of said positioning apparatus at each said location.

4. A storage system as recited in claim 3 wherein said automatic calibration includes using said approximate location data to direct said robotic apparatus to move said sensor to a selected carrier storage location and perform said detecting.

5. A storage system as recited in claim 4 wherein said calculating further includes calculating said accurate coordinate from said signal, said coordinate for directing said robotic apparatus to move a selected carrier from a first location to a second location.

6. A storage system as recited in claim 2 wherein said precision structure is a moveable calibration fixture including
   (a) a fixture base dimensioned to correspond to dimensions of a storage carrier base for allowing said fixture to be precisely located on a selected carrier storage location relative to said positioning apparatus; and
   (b) a fixture flange precisely attached to and positioned from said fixture base to correspond to a position of a corresponding carrier flange positioned in reference to said carrier base.

7. A storage system as recited in claim 2 wherein said precision structure is a separate structure permanently attached to each said location.

8. A storage system as recited in claim 2 wherein said positioning apparatus includes at least two dowel pins.

9. A storage system as recited in claim 8 wherein said precision structure includes said at least two dowel pins.

10. A storage system as recited in claim 1 wherein said sensor is a optical emitter-detector.

11. A storage system as recited in claim 1 wherein said sensor is a touch sensor.

12. A storage system as recited in claim 1 wherein said sensor apparatus detects two coordinates of said precision structure.

13. A storage system as recited claim 1 wherein said sensor apparatus detects three coordinates of said precision structure.

14. A storage system as recited in claim 6 further comprising:
   (a) a fixture height sensor for detecting when said tool engages said fixture flange for lifting said fixture; and
   (b) wherein said controller receives a signal from said fixture height sensor and calculates a height of said flange as said fixture is lifted from a rest position.

15. A method of operation of a wafer carrier buffer comprising:
   (a) first programming a controller with approximate coordinates of each of a plurality of buffer locations, each location having facility for holding a carrier;
   (b) first directing a robotic arm in proximity to a said location using said approximate coordinates;
   (c) second directing a sensor associated with said robotic arm to sense a structure associated with said location, said sensor to output a signal indicative of a position of said structure;
   (d) calculating from said signal, precision coordinates for accurately placing a carrier at said location;
   (e) repeating steps b, c and d until coordinates for accurately placing a carrier are calculated for all said locations.

16. A method as recited in claim 15 further comprising placing a calibration fixture at said location using said robotic arm, said placing using said approximate coordinates and said placing performed prior to said first directing;
   wherein said calibration fixture has a flange in a position corresponding to a flange of a carrier; and
   wherein said flange is said structure.

17. A method as recited in claim 15 further comprising picking up a carrier at a first location and placing said carrier in a second location, wherein said placing includes said controller using said precision coordinates to direct a tool associated with said arm for engaging said carrier.

18. A method as recited in claim 15 wherein said sensor is a optical emitter-detector.

19. A method as recited in claim 15 wherein said sensor is a touch sensor.

20. A method as recited in claim 15 further comprising:
(a) detecting when a tool positionable by said arm engages a carrier flange and makes contact with said flange for lifting said carrier; and
(b) calculating a height of said flange as said carrier is moved in a vertical direction, said calculating being performed by said controller.

\* \* \* \* \*